United States Patent [19]

Cruz et al.

[11] Patent Number: 5,241,758
[45] Date of Patent: Sep. 7, 1993

[54] PROCESS FOR PROTECTING SURFACES AGAINST AMBIENT PARTICULATE CONTAMINATION WITH THE AID OF BLOWING ELEMENTS

[75] Inventors: Didier Cruz, Grenoble; Jacques Daval, Meylan; Jean-Pierre Lazzari, Corenc; Francois Torrecillas, Saint Pancrasse, all of France

[73] Assignee: Commissariat a l'Energie Atomique, Paris, France

[21] Appl. No.: 690,001

[22] Filed: Apr. 23, 1991

[30] Foreign Application Priority Data

Apr. 24, 1990 [FR] France .................... 90 05210

[51] Int. Cl.$^5$ .................................................. F26B 3/00
[52] U.S. Cl. ........................................... 34/22; 34/107
[58] Field of Search ............. 34/22, 23, 15, 29, 151, 34/148, 107

[56] References Cited

U.S. PATENT DOCUMENTS 4,236,851 12/1980 Szasz .

FOREIGN PATENT DOCUMENTS 224034 6/1987 European Pat. Off. .
346224 12/1989 European Pat. Off. .

OTHER PUBLICATIONS

IBM Technical Disclosure Bulletin, 22(5), 1864–65 (1979) "Diverted flow Bernoulle Pick-up Device", Balder and Cachon.

Primary Examiner—Henry A. Bennet
Attorney, Agent, or Firm—Michael N. Meller

[57] ABSTRACT

The blowing ramp formed by the blowing elements makes it possible to maintain under an ultra-clean atmosphere the planar services of objects during their transportion or conveying, whilst using a limited air flow; the blowing elements are mainly constituted by a plate 2 having a central orifice 6 facing which is located a pipe 4 supplied with ultra-clean air; the process consists of placing the surface (11) of the object (10) at a distance (d) of approximately 1 mm from the blowing surface (7). The flow of air between these two surfaces is easily regulated in such a way as to be laminar, thus providing protection against ambient particulate contamination, which application may be applied to the conveying of silicon wafers.

10 Claims, 4 Drawing Sheets

PROCESS FOR PROTECTING SURFACES AGAINST AMBIENT PARTICULATE CONTAMINATION WITH THE AID OF BLOWING ELEMENTS

DESCRIPTION

1. Field of the Invention

The invention relates to the storage and in particular the transportation or conveying of parts, whereof one surface has to be kept in an ultra-clean environment. It more particularly applies to the protection against ambient particulate contamination or pollution of silicon wafers during their conveying.

2. Prior Art

During the manufacture of integrated circuits, the silicon wafers supporting said circuits are stored in loading and unloading stations. They are conveyed by appropriate conveying means, such as air cushions, belt conveyors and vacuum grippers. These displacements take place between the different treatment stations, which can be a reactor, an oven or an isolator. The wafers can then be stored again. The various treatment stations are in an ultra-clean, non-polluting environment for the silicon wafers. However, a contamination by dust is still possible during conveying, unless special environmental precautions are taken.

In order to solve the problem of contamination during the movement of the silicon wafers to the stations, conveying means are normally placed in a rigid, matched tube, which is subject to a non-polluting air flow. This solution suffers from the major disadvantage of requiring a means which is adapted once and for all to the equipment and which is difficult to apply to all transportation cases encountered during the movement of silicon wafers.

In addition, French patent application No. 2 632 617 discloses a passage or channel appropriate for the conveying of parts in an ultraclean environment. This passage comprises a first type of horizontal unitary elements constituted by unitary ducts having nozzles and an attachment system. Two air-permeable, flexible lateral skirts are constituted by a second type of vertical unitary elements. As the horizontal ducts are connected to a pressurized air source, the nozzles project said air into the passage constituted by the horizontal unitary ducts and the lateral elements forming the skirt. These elements are assembled with one another so as to match the geometry of the path to be protected. The passage serves to protect silicon wafers against pollution during their transportation. This type of passage can be effective in maintaining an ultra-clean environment, but involves significant air flows.

The object of the invention is to supply means for protecting silicon wafers during their conveying using the technique of blowing pressurized air, but whilst avoiding the aforementioned disadvantage.

SUMMARY OF THE INVENTION

Therefore a first object of the invention is a process for protecting the surfaces of objects against ambient particulate contamination, by confining the objects in an ultra-clean air atmosphere by means of blowing elements distributing the ultra-clean air through air distribution orifices issuing by a blowing surface into a space in which is placed the objects to be confined.

According to the invention, the blowing surface by which the orifices issue has a shape complementary to that of at least the periphery of the surfaces to be protected, the inventive process consisting of placing the surfaces to be protected at a relatively short distance from the blowing surface so that the flow of ultra-clean air from the orifices occupies the volume defined by the surfaces to be protected and the blowing surface positioned facing one another and so that said flow is of a laminar nature, at least on the periphery of the object to be protected.

The efficiency of this process is increased when the surfaces of the objects to be protected are centered with respect to the orifices of the blowing surface, so that the air flow is symmetrical. It is consequently possible to store below the blowing surface objects, whose surfaces to be protected have a shape complementary to that of the blowing surface.

In order to adapt this process to the transportation or conveying of objects, a preferred embodiment of the invention consists of using several blowing elements placed end to end to constitute a continuous ramp and which serves to confine the surfaces to be protected during the conveying of the objects from one end of the ramp to the other.

In order to realize the process according to the invention, a second object thereof is a blowing element having a plate with a surface constituting the said blowing surface onto which issues at least one central orifice and a pipe fixed to the plate issuing laterally into the orifice and which can be connected to an ultra-clean air source.

These blowing elements are given two main constructional forms namely a longitudinal form, the blowing element being a longitudinal slot and a round form with a single central orifice in the blowing element plate.

With a view to obtaining a ramp adaptable to the path covered by the objects whose surfaces are to be protected, it is possible to use several longitudinal elements placed end to end in order to constitute straight line portions of a blowing ramp, the direction changes of said blowing ramp being ensured by round elements.

A preferred variant of a thus formed ramp provides for the elements constituting the ends having a transverse pipe portion forming a transverse air curtain at the outlet from the blowing ramp.

BRIEF DESCRIPTION OF DRAWINGS

The invention is described in greater detail hereinafter relative to non-limitative embodiments and the attached drawings, wherein show.

DETAILED DESCRIPTION OF AN EMBODIMENT

Figure 1:
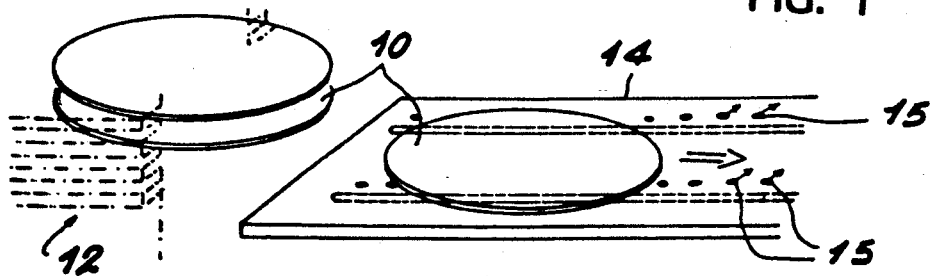
FIG. 1 a straight line element of a means for conveying silicon wafers to which the present invention applies.

The conveying means for flat objects, such as silicon wafers, shown in FIG. 1 is a path or track 14 having air jet ducts 15 issuing obliquely in the longitudinal direction, so as to advance the silicon wafer 10. This track 14 is positioned at the outlet of a case 12 in which are arranged several silicon wafers 10.

There are also other means for conveying the silicon wafers 10. Thus, it is possible to use conveyors constituted by two horizontal, parallel belts moving horizontally in the same direction.

These two conveying means types make it possible to cause the silicon wafers to carry out straight line displacements. However, in most uses of such silicon wafer conveyors, it is necessary to make direction changes during the conveying of said wafers.

Figure 2:
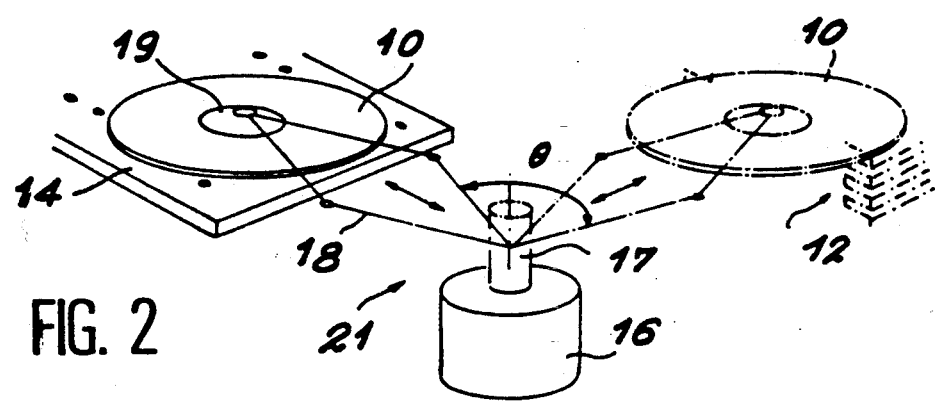
FIG. 2 a direction change device for the conveying means of the silicon wafers to which the invention applies.

FIG. 2 shows one of the direction change devices, which consists of placing a suction gripper 21 in the vicinity of a track 14. The gripper is constituted by a base block 16 fixed with respect to the track 14 and supporting a vertical rotary shaft 17. On the latter is mounted a pantograph-type articulated system 18, whereof a first apex is fixed to the shaft 17 and whereof the second apex is equipped with a suction device. The complete opening out of the pantograph 18 enables the suction device 19 to move above the track 14 in order to take up a silicon wafer 10. The bending back of the pantograph 18 makes it possible to bring the silicon wafer above the base block 16. This is followed by a rotation of the rotary shaft 17 by an angle $\theta$ corresponding to the angle formed by the direction of the upstream track 14 and the downstream track, which is symbolized in FIG. 2 by a case 12. The pantograph 18 is then opened out again to place the silicon wafer 10 in the case 12.

The protection process and the various elements which it uses are described hereinafter.

Figure 3:
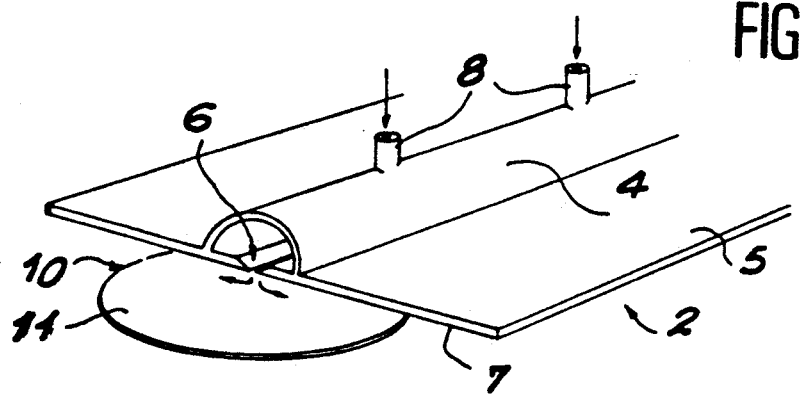
FIG. 3 a longitudinal element used in the process according to the invention.

The element shown in FIG. 3 is a longitudinal blowing element used for forming a blowing ramp. It is constituted by a planar plate 2 forming a blowing top. It has orifices 6 issuing onto its lower surface 7, which is therefore a blowing surface. A pipe 4 is fixed to the upper surface 5 of the plate 2 facing the central orifices 6. The pipe 4 shown in FIG. 3 has a semicylindrical shape. However, this only constitutes an exemplified embodiment, the result necessary for the efficiency of the process being that said pipe 4 supplies the central orifices 6 with air. The supply of said pipe 4 with ultra-clean air can be obtained by means of ducts 8 issuing into the said pipe 4. The central orifices 6 are generally constituted by a single longitudinal slot.

As shown in FIG. 3, a silicon wafer 10 is placed just below the blowing element.

Figure 4:
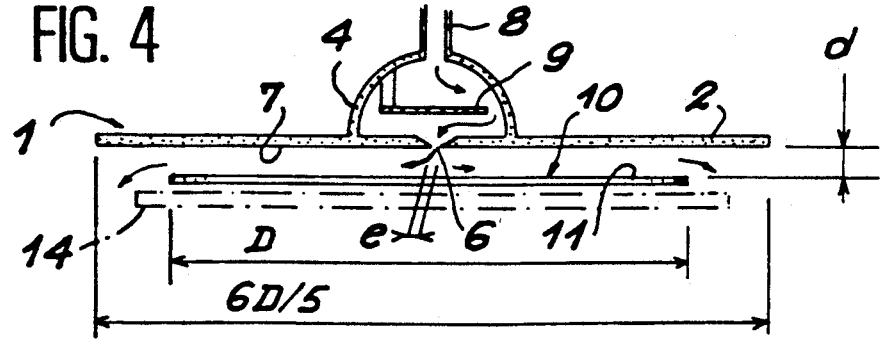
FIG. 4 a cross-section through the longitudinal element of FIG. 3.

FIG. 4 shows in greater detail the position of the silicon wafer 10 with respect to the longitudinal element 1. Thus, the silicon wafer 10 is placed at a distance d of approximately 1 mm. More precisely, in the case of the application to silicon wafers, said distance is generally between 0.5 and 3 mm. It is clear that the ultra-clean air issuing from the pipe 4 by the orifices 6 also strikes the surface to be protected of the silicon wafer 10. In a preferred, but non-limitative manner, the latter is positioned symmetrically with respect to the orifices 6, so that the ultra-clean air issuing from these orifices 6 of the blowing surface 7 is distributed in an equal manner on both sides of the volume formed by the blowing surface 7 and the upper surface 11 to be protected of the silicon wafer 10.

Each pipe 4 can be internally supplemented by a baffle plate 9 in FIG. 4. The latter is positioned facing the supply orifices 8 issuing into the upper part of the pipe 4. The baffle plate 9 lengthens the path of the ultra-clean air in the pipe 4 in order to improve the distribution of the latter throughout the volume of said pipe 4. This has the effect of making the air flow in the longitudinal slot 6 more uniform.

With a view to obtaining a laminar flow in said volume, i.e. a regular flow without turbulence and without an opposing air stream, the orifices 6 can be given a particular shape. As shown in FIG. 4, the orifices 6 can be constituted by a longitudinal slot preferably having a V shape within the pipe 4. The final spacing e of the longitudinal slot is preferably between 0.3 and 2 mm.

It is pointed out that the distance d separating the silicon wafer 10 from the blowing surface 7 and the spacing e of the longitudinal slot formed by the orifices 6 condition, with the diameter D of the silicon wafer 10, the ultra-clean air flow rate Q. Thus, the latter must assume a value between a minimum and a maximum flow rate. The minimum flow rate is that for which the air can still sweep the entire surface 11 of the silicon wafer 10 and pass out of the periphery thereof. The maximum flow rate is just below that where the ultra-clean air flow becomes turbulent.

The plate 2 is also dimensioned as a function of the diameter D of the silicon wafer 10. It is necessarily wider than the diameter D of the silicon wafer 10, said width preferably being equal to $D \times 6/5$.

For silicon wafers with a diameter D equal to 150 mm, a spacing e of the longitudinal slot equal to 0.5 mm, a distance d from the silicon wafer 10 to the plate 2 of 3 mm, the contamination of the wafers conveyed beneath these elements is at a minimum for a flow rate of 2 to 3 $m^3/h.m$ of the thus formed blowing ramp. It is therefore preferable in this case to have a flow rate of approximately 5 $m^3/h$.

With the aid of the operating conditions referred to in the previous paragraph, a calculation involving the use of the Reynolds R number and the kinematic viscosity of the air $v$ makes it possible to check the laminar state of the air flow between the two parallel surfaces.

The mean velocity $V_m$ is equal to $V_m = Q/S$, Q being the flow rate intercepted by a silicon wafer subject to a flow rate of 5 $m^3/h.m$. The flow rate intercepted by a silicon wafer is consequently equal to $1.Q \times D/L$, D being the diameter of the silicon wafer and L the length covered. Therefore the flow rate intercepted by a wafer of diameter 6" (150 mm) is equal to $5 \times 0.15:1 = 0.75$ $m^3/h$.

The air volume passing out of one side of a silicon wafer is consequently 0.375 $m^3/h$ through an outlet cross-section of $D \times d$, i.e. $0.45 \times 10^{-3}$ $m^2$. The issuing velocity $V_m$ is equal to $0.375/3,600 \times 1/0.45.10^{-3}$, i.e. approximately 0.23 m/s. Therefore the Reynolds R number is equal to $V_m \times e/v$ of $23 \times 3.10^{-1}/15.10^{-2}$, i.e. approximately 50.

For a flow between two parallel planes, it is accepted that when the Reynolds R number is below 1400, perfectly laminar conditions exist, i.e. the case of the previous example.

Figure 5:
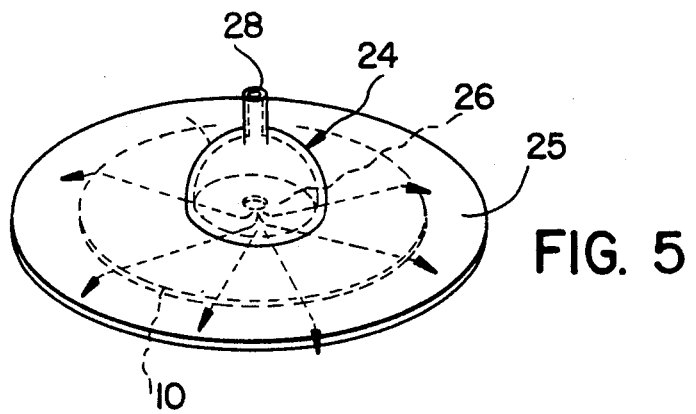
FIG. 5 a round element used in the process according to the invention.

FIG. 5 shows a circular blowing element. Its structure and operation are identical to those of a longitudinal blowing element. The fundamental difference compared with the longitudinal element are that the pipe is reduced to a simple hemispherical shape 24. It is applied to a circular plate 25 above a central orifice 26 and is supplied by a duct 28 connected to an ultra-clean air source.

The flow of air through the central orifice 26 takes place in an identical manner to the flow obtained with a longitudinal blowing element, i.e. said flow is symmetrical with respect to the centre of the circular plate 25 and remains laminar.

Figure 6:
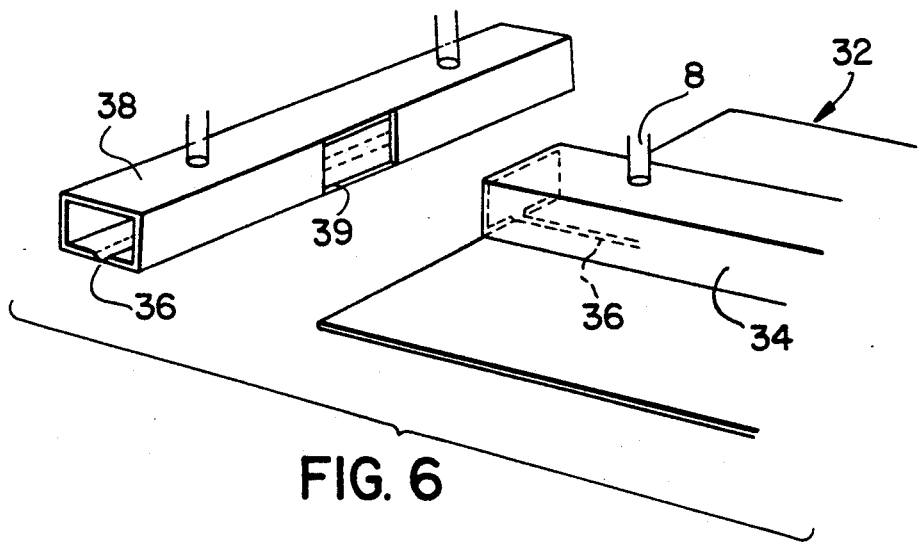
FIG. 6 an embodiment of a ramp end element according to the invention.

With reference to FIG. 6, it is possible to envisage different constructions of the longitudinal blowing elements. It is possible to see in FIG. 6 a rectangular pipe 34, which is supplied by ducts 8 connected to a pressurized ultra-clean air source.

In the case where the longitudinal element 32 constitutes the end of a blowing ramp, it can be equipped with an end element 38 constituted by a transverse pipe portion connected to the pipe 34 by a lateral opening 39 positioned in the centre of the pipe 38. In an identical manner to the pipe 34 of the longitudinal element 32, pipe 38 has a slot 36 identical to that described relative to FIGS. 3 and 4. Thus, said pipe can also be supplied with ultra-clean air, a transverse air curtain providing a supplementary protection for the silicon wafers against contamination.

The most advantageous use of the invention consists of forming a blowing ramp having for the straight portions longitudinal elements 32 and for the direction changes round blowing elements, in the manner described relative to FIG. 5.

Figure 7:
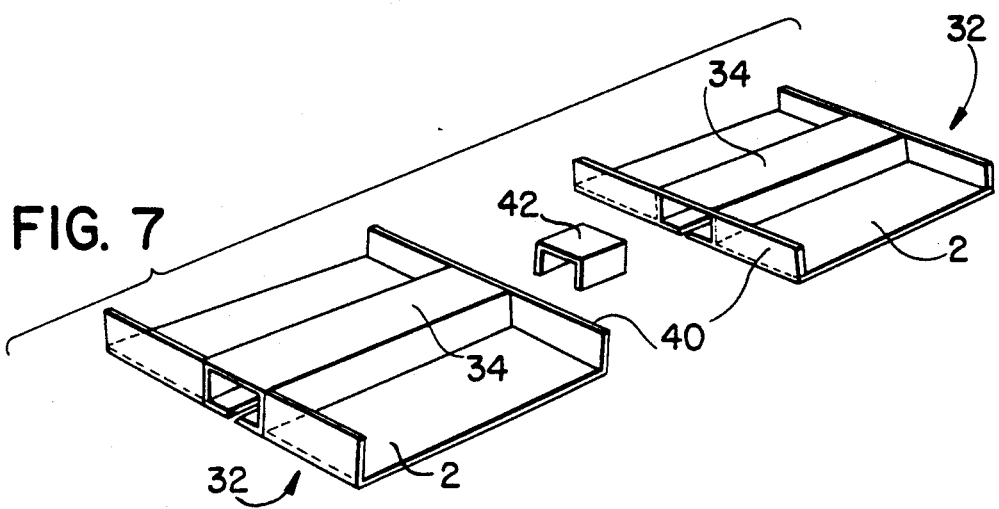
FIG. 7 an example of the assembly of two longitudinal elements of the ramp according to the invention.

With reference to FIG. 7, the different longitudinal blowing elements 32 can be assembled by locking edges or sides 40. The latter are positioned transversely and vertically with respect to the plates 2 at each end thereof. If appropriate, said edges can seal the pipes 34. The longitudinal elements 32 are assembled by moving together engaging the transverse edges 40 located at the respective ends of the longitudinal elements and maintaining them together by locking and adhesion.

The embodiment described only constitutes an example. Thus, they can be placed end to end and held together by a complementary adapting part 42 forming a pipe portion. This intermediate part 42 is inserted in the respective ends of the pipes 34 of the two longitudinal elements 32.

Figure 8:
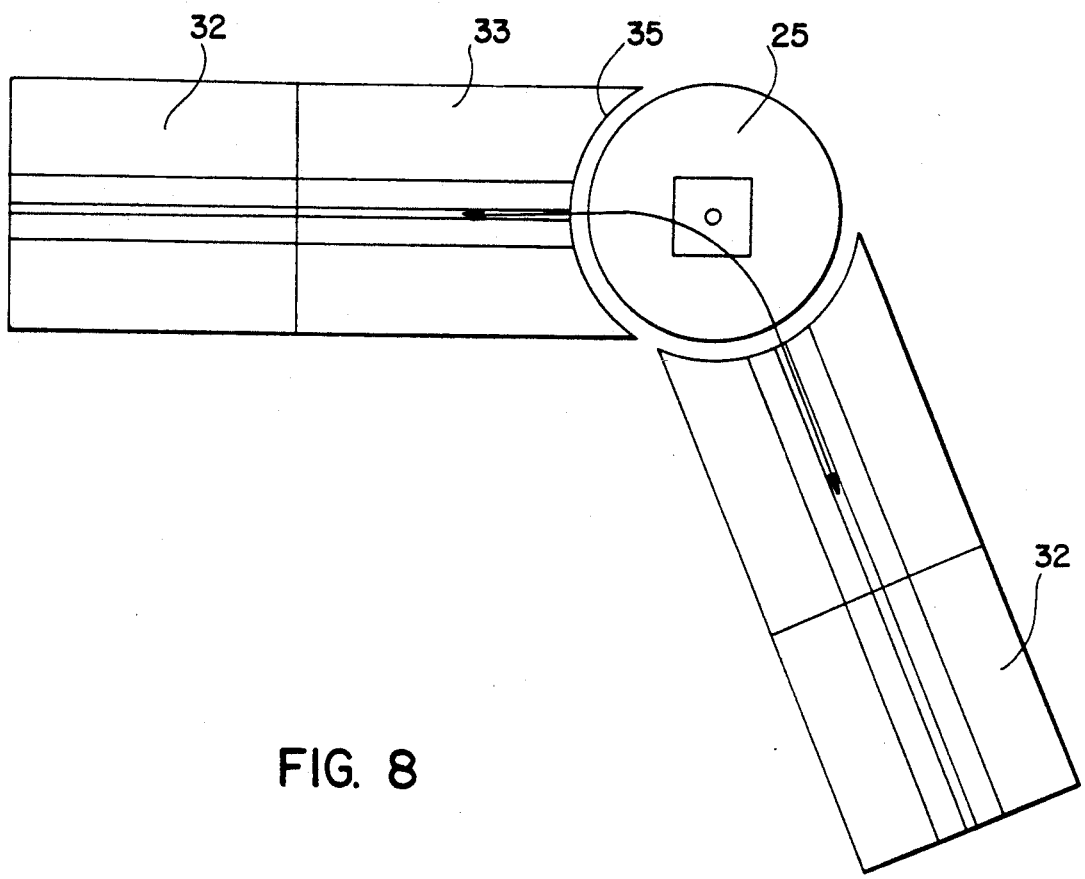
FIG. 8 a plan view of a ramp according to the invention with a direction change.

FIG. 8 is a plan view of a blowing ramp using first longitudinal blowing elements 32 and a circular blowing element 25 for carrying out a direction change between two straight line portions. Other longitudinal elements 33 are used for forming the joint between the longitudinal blowing elements 32 and the circular blowing element 25. These second longitudinal blowing elements 33 have a concave, circular cut end 35 complementary to the outer shape of the circular blowing element 25.

Figure 9A:
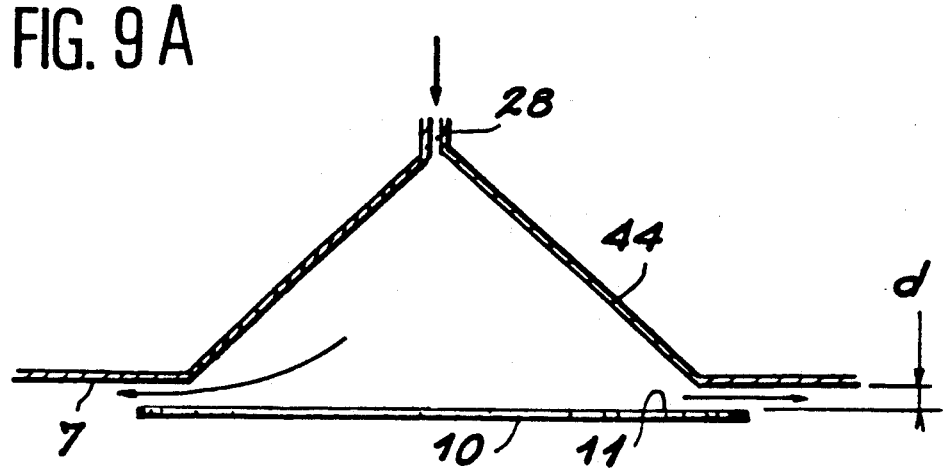
FIGS. 9A and 9B a constructional variant of a round element used in the process according to the invention.
Figure 9B:
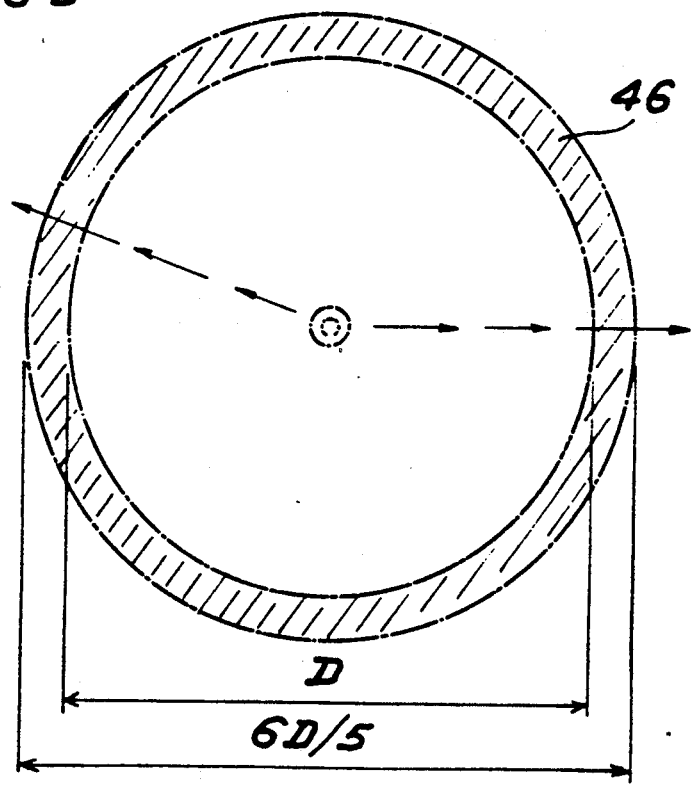

As shown in FIGS. 9A and 9B, it is possible to envisage a constructional variant of the round blowing element. Thus, it is possible for the shape of the blowing surface 7 of the blowing element to only be complementary over part of the surface 11 to be protected. As the inventive concept is based on the fact of creating a laminar ultra-clean air flow on the surface 11 to be protected, so that no polluting particles can enter on the side of the surface 11 to be protected, it is possible to limit said laminar flow to the periphery of said surface 11. Thus, as shown in FIG. 9A, the blowing surface 7 is only parallel to the surface 11 to be protected on its periphery. The remainder of the blowing surface can be constituted by a cone 44 directly connecting the duct 28 to the blowing surface 7. The ultra-clean air is symmetrically distributed in the thus defined pyramidal volume. The laminar flow takes place in the peripheral portion, i.e. when the ultra-clean air is confined between two portions of parallel surfaces.

FIG. 9B is a plan view corresponding to FIG. 9A. The crown-shaped zone 46 corresponds to the zone where the ultra-clean air flow is laminar. In view of the thickness variation between the surface 11 to be protected and the blowing element, the velocity of the ultra-clean air is virtually zero in the centre of said element when it passes out of the duct 28. As the thickness decreases, the velocity of the flow increases, as symbolized by the radially oriented vectors in FIG. 9B. In this case the blowing element must have a diameter larger than the diameter D of the surface 11 to be protected and in the present case a diameter of 6D/5.

In this case, the air flow and the distance d separating the two surfaces at their periphery also contribute to forming a protective curtain having an efficiency equivalent to that of the previously described constructions.

Thus, it is possible to construct blowing ramps adapted to any random path of objects having a horizontal planar surface to be protected against the ambient contamination, the adaptation of the shape of the blowing ramp taking place as a result of different types of blowing elements proposed, i.e. longitudinal, round and end elements.

We claim:

1. Process for the protection of surfaces (11) of objects (10) against ambient particulate contamination by confinement of the objects (10) in an ultra-clean air atmosphere by means of blowing elements (25,32,33,38) distributing the ultra-clean air through air distribution orifices (6,36) issuing by a blowing surface (7) into a space where the objects (10) to be confined must be placed, characterized in that the blowing surface (7) by which issue the orifices (6,36) has a shape complementary to that of at least the periphery of the surfaces (11) to be protected and it consists of placing said surfaces (11) at a relatively short distance (d) from the blowing surface (7), so that the flow of ultra-clean air in the volume formed by the surfaces (11) to be protected and the blowing surface (7), positioned in parallel facing manner, is laminar, at least at the periphery of the object to be protected.

2. Process according to claim 1, characterized in that the surfaces (11) to be protected of the objects (10) are centered with respect to the orifices (6,36).

3. Process according to claim 1, characterized in that it consists of using several blowing elements (25,32,33,38) placed end to end in order to form a continuous ramp serving to confine the surfaces (11) to be protected during the transfer of the objects (10) from one end to the other of the ramp.

4. A blowing element which will protect the surfaces (11) of the objects (10) against ambient particulate contamination by confinement of the objects (10) in an ultra-clean air atmosphere by means of blowing elements (25, 32, 33, 38) which will distribute the ultra-clean air through air distribution orifices (6, 36) which issue by a blowing surface (7) into a space where the objects (10) to be confined must be placed, characterized in that the blowing surface (7) by which issue the orifices (6, 36) has a shape complementary to that of at least a periphery of the surfaces (11) to be protected and it consists by placement of said surfaces (11) at a relatively short distance (d) from the blowing surface (7), so that the flow of ultra-clean air in the volume formed by the surfaces (11) to be protected and the blowing surface (7), positioned in parallel facing manner, is laminar, at least at the periphery of the object to be protected.

5. Blowing element according to claim 4, characterized in that it is longitudinal (32,33) and that the central orifices are constituted by a longitudinal slot (36).

6. Blowing element according to claim 4, characterized in that it is round (25) and in that the central orifice is constituted by a single central orifice (26).

7. A blowing ramp which is characterized by the use of several blowing elements (25, 32, 33, 38) placed end to end in order to form a continuous ramp serving to confine the surfaces (11) to be protected during the transfer of the objects (10) from one end to the other of the ramp, characterized in that it comprises several blowing elements assembled with one another and each constituted by a plate (2) having a blowing surface (7) and at least one central orifice (6, 26, 36), a pipe (4,24, 34) fixed to the plate (2) issuing laterally into the orifice (6, 26, 36) and which can be connected to an ultra-clean air source, certain blowing elements (32, 33) being longitudinal, their central orifices being constituted by a longitudinal slot (36), other blowing elements (25) being round and having a single central orifice (26) and so as to constitute a blowing ramp adaptable to the path covered by the objects (10) carrying the surface (11) to be protected, the various blowing elements being placed end to end.

8. Blowing ramp according to claim 7, characterized in that it comprises at each end, end elements (38) having a transverse pipe portion for forming a transverse air curtain.

9. Blowing element according to claim 4, characterized in that each pipe is completed by a baffle plate (9) positioned facing the supply ducts (8) issuing into the pipes (4,24,34) in order to improve the distribution of the ultra-clean air throughout the pipe (4,24,34).

10. A blowing element in accordance with claim 4 which will protect surfaces (11) of objects (10) against ambient particulate combination by confinement of the objects (10) in an ultra-clean air atmosphere by means of blowing elements (25, 32, 33, 38) distributing the ultra-clean air through distribution orifices (6, 36) issuing by a blowing surface (7) into a space where the objects (10) to be confined must be placed, characterized in that it comprises a plate (2) having a surface constituting the blowing surface (7) and incorporating at least one central orifice (6, 26, 36) and a pipe (8, 24, 34) fixed to the plate (2) issuing laterally into the orifice (6, 26, 36) and connectable to an ultra-clean air source.

* * * * *